United States Patent [19]

Spletter et al.

[11] Patent Number: 5,164,566
[45] Date of Patent: Nov. 17, 1992

[54] METHOD AND APPARATUS FOR FLUXLESS SOLDER REFLOW

[75] Inventors: Philip J. Spletter, Cedar Park; Claire T. Galanakis, Austin, both of Tex.; William G. Flynn, Oakland, Calif.

[73] Assignee: Microelectronics and Computer Technology Corp., Austin, Tex.

[21] Appl. No.: 536,973

[22] Filed: Jun. 12, 1990

[51] Int. Cl.⁵ ............................................. B23K 26/00
[52] U.S. Cl. ................................................. 219/121.63
[58] Field of Search ................. 219/121.63, 121.64, 219/121.13, 121.14

[56] References Cited

U.S. PATENT DOCUMENTS

| | | | |
|---|---|---|---|
| 4,535,219 | 8/1985 | Sliwa et al. | 219/121.61 X |
| 4,587,395 | 5/1986 | Oakley et al. | 219/121.64 |
| 4,700,044 | 10/1987 | Hokanjon et al. | 215/121.63 |
| 4,893,742 | 1/1990 | Bullock | 228/110 |
| 4,926,022 | 5/1990 | Freedman | 219/121.64 X |

OTHER PUBLICATIONS

*The Handbook of Machine Soldering* (2nd ed. 1988) Ralph W. Woodgate.
*Solders and Soldering* (2nd ed. 1979) Howard Manko.
R. K., "Cost Effective Packaging is Target at MCC," Electronic Packaging & Production, pp. 13–14, Apr. 1988.
DeVore et al., "To Solder Easily," Circuits Manufacturing, pp. 63–65 and 70, Jun. 1984.
"Tech Briefs," Laser Focus/Electro-Optics, pp. 42, Jul. 1987.
Miller, "Soldering With Light," Photonics Spectra, pp. 83–36, May, 1983.
Lea, "Laser Soldering—Production and Microstructural Benefits of SMT," Soldering and Surface Mounting Technology, No. 2, Jun. 1989, pp. 13–21.

*Primary Examiner*—C. L. Albritton
*Attorney, Agent, or Firm*—Johnson & Gibbs

[57] ABSTRACT

A method for reflowing solder without flux includes the steps of placing a first metallic element in contact with a second, solder-plated element, thereby defining a bond site; and causing a laser beam to impinge on the bond site. An apparatus for performing the above method is also disclosed.

18 Claims, 8 Drawing Sheets

METHOD AND APPARATUS FOR FLUXLESS SOLDER REFLOW

BACKGROUND OF THE INVENTION

The present invention relates to bonding techniques and, more particularly, to solder reflow processes.

DESCRIPTION OF RELATED ART

In the art of electronic circuit fabrication, it is often necessary to bring certain surfaces into electrical contact. For example, integrated circuits (or "chips") are often mounted on printed wiring boards (PWB's), or other such devices, which may be generally referred to as substrates. The contact between the chip and substrate must have electrical, physical and chemical stability and integrity.

Solder; i.e., a low melting point alloy, typically of the lead-tin type; is frequently used in the production of electronic components to join integrated circuit modules or chip carriers to circuit cards or circuit boards. For example, solder may be used to connect conductive metal pins from a module to the conductive circuit lines of a circuit card. It is known to apply solder to the components in the form of a solder preform or a solder paste. A solder preform is a solid composition of solder fabricated to the shape and dimensions required to contact the desired locations of each of the components to be joined. The preform is placed in proper position and subsequently heated to cause the solder to flow, or "reflow", and physically join the components. A solder paste is a composition of a solder powder and one or more liquid solvents and binders. The paste is screened onto the components, dried, and heated to reflow the solder and join the two components. For both preforms and pastes, flux; i.e. a liquid or solid material which when heated exercises a cleaning action upon the oxidized surfaces to which it is applied, e.g., waterwhite rosin; is typically used to deoxidize the metal surfaces of the components to cause them to accept the solder.

At present, most soldering processes comprise three basic steps: (1) pre-cleaning and deoxidation of surface oxides; (2) solder reflow and/or reflow joining; and (3) post-soldering cleaning. The pre-cleaning step is performed with different flux materials to prepare the surfaces for the soldering step by removal of contaminants and metal oxides from the solder and the surfaces to be joined. The solder joining step can occur only after the oxide coating is removed because the high melting point oxides will prevent the wetting (i.e., a metallurgical process that results in a smooth layer of solder firmly adherent to base metals) of the two surfaces to be joined by reflow of the solder. Solder reflows into its characteristic smooth fillet shape when heated, and joins the surfaces in contact with the solder. The third step, post-soldering cleaning, removes any flux residue after the first two steps.

The post-soldering step has become more difficult to perform effectively as the size of electronic components has shrunk, making it much more difficult for the post-soldering cleaning agents; e.g., perchloroethylene or N-methyl pyrollidone, Methylene Chloride, Methylchloroform, or Freon; to penetrate the increasingly smaller gaps between the components and the substrate. The post-soldering step becomes even more difficult when Surface Mount Technology (SMT) is employed.

Inefficient fluxing, when necessary to be performed, results in defective bonding. Inefficient post-soldering cleaning, when flux is employed, reduces the long term reliability of the whole assembly. A large investment in cleaning equipment, materials, and processes can solve some of the aforementioned problems; however, the fact remains that most cleaning solvents contain CFC's or other elements that are environmentally damaging and possibly prohibited.

A dry or fluxless soldering process can replace the precleaning step and totally eliminate the post-soldering cleaning step.

Various attempts at fluxless soldering have been made; however, these attempts have suffered from limitations that made them applicable only to a small number and very specific applications.

For example, Moskowitz and Yeh in "Thermal Dry Process Soldering," J. VAC. SCI. TECHNOL. A, Vol. 4, No. 3, May/June, 1986, describe a dry soldering process for solder reflow and bonding of Pb/Sn solder. Moskowitz and Yeh's process uses halogen containing gases to reduce surface oxides to enable solder reflow at temperatures above the solder melting point. The activation energy needed for the oxide reduction by these gases is lowered by the use of a catalyst in a vacuum chamber. However, it should be noted that the temperature needed for successful reflow bonding according to the teachings of Moskowitz and Yeh is 350° C. This temperature is well above the typical soldering temperature for most electronic applications, i.e., 220° C., and can damage the components or the substrate, and/or generate defects due to thermal mismatch between different materials.

Another attempt at fluxless soldering is disclosed in IBM Technical Disclosure Bulletin Vol. 27, No. 11, April, 1985, entitled, "Dry Soldering Process Using Halogenated Gas." This IBM bulletin discloses the use of halogenated gases in an inert carrier gas at an elevated temperature to produce a reduction of solder oxide by the reactive gas and to allow solder reflow. Again, for the more common low temperature applications, thermal damage may result.

Moskowitz and Davidson in "Summary Abstract: Laser-Assisted Dry Process Soldering," J. VAC. SCI. TECHNOL. A., Vol. 3, No. 3, May/June, 1985, describe a laser-assisted fluxless soldering technique for solder reflow. This technique uses laser radiation to excite an otherwise non-reactive gas in the presence of pre-heated solder surface. This approach has been criticized by certain persons skilled in the art for being of limited applicability because direct access of laser radiation to the solder surface is required and because it appears to be a low throughput process. An example of such criticism may be found in the background of the invention section in U.S. Pat. No. 4,921,157 to Dishon et al.

Other attempts to remove surface oxides have employed sputtering. The sputtering methods, however, are extremely inaccurate and can damage the substrates and components while removing oxides, and are very limited in penetration distances, making sputtering unsuitable to applications like solder reflow.

In summary, although a number of attempts have heretofore been made to develop a method for fluxless solder reflow, none of the attempts have been universally well received nor have any been well suited for possible use in commercial circuit production. Thus, it is a deficiency and shortcoming of the prior art that a fluxless solder reflow process that does not have deleterious effects on printed circuit boards has not been developed.

SUMMARY OF THE INVENTION

The present invention addresses the above-identified shortcomings and deficiencies by providing a method and apparatus for reflowing solder without flux, the disclosed method including the steps of placing a first element in contact with a second, solder-plated element, thereby defining a bond site; and causing a laser beam to impinge upon the bond site. In embodiments of the present invention, a pulsed Nd: YAG laser is employed to deliver approximately 40-660 millijoules of energy, depending on the size of the leads and the pads (i.e., the thermal mass of the structure), to the bond site via its output beam.

Accordingly, it is an object of the present invention to eliminate the need for flux to reflow solder.

Another object of the present invention is to provide a relatively inexpensive solder reflow process.

Yet another object of the present invention is to provide a relatively environmentally safe solder reflow process.

Still yet another object of the present invention is to provide a process by which certain small pitch devices can be made more reliably.

BRIEF DESCRIPTION OF THE DRAWINGS

Other objects, advantages and novel features of the present invention will become apparent from the following detailed description of the invention taken in conjunction with the accompanying drawings in which.

DETAILED DESCRIPTION OF THE INVENTION

While the present invention will be described, for purposes of illustration only, with special reference to lead bonding to PWB's, the method and apparatus for fluxless solder reflow described herein are applicable to a wide variety of processes for bonding a multitude of different types of electrical members to each other.

Figure 1:
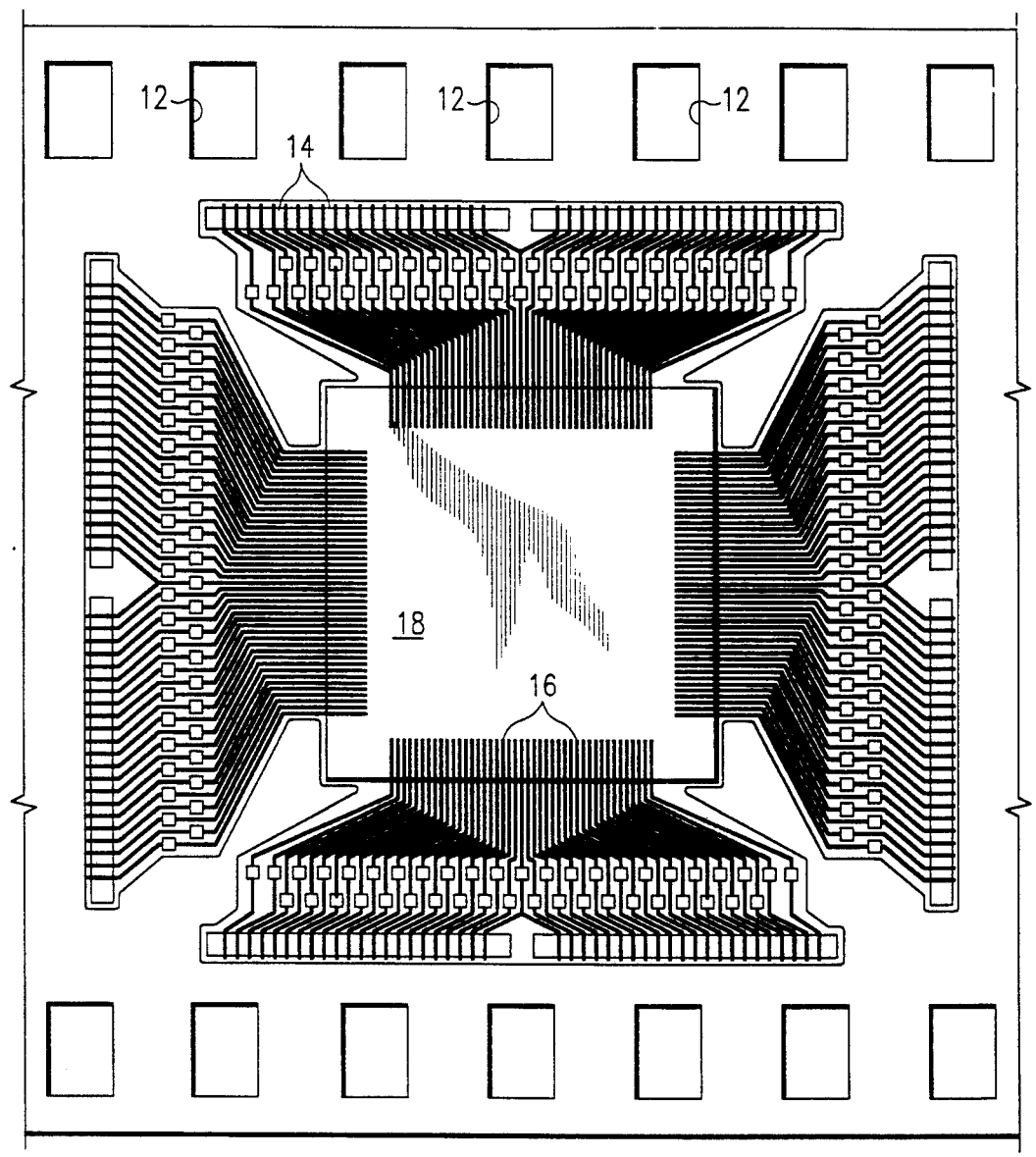
FIG. 1 is a fragmentary enlarged elevational view of a TAB tape with an integrated circuit die in place for bonding.

Referring now to the drawings, and particularly to FIG. 1, reference numeral 10 generally indicates a portion of a tape automated bonding (TAB) tape having the usual sprocket holes 12, plurality of outer leads 14, and plurality of inner leads 16 for bonding to an integrated circuit die 18 having active semiconductor circuitry thereon.

Figure 2:
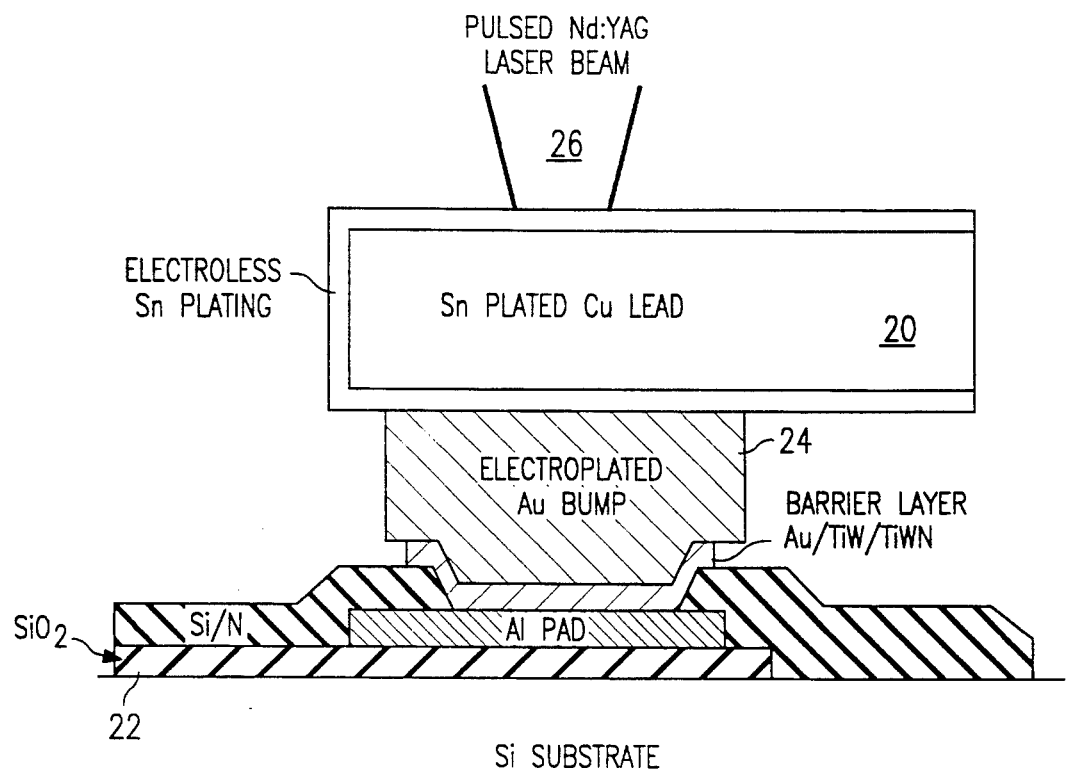
FIG. 2 is a cross sectional view of a bond structure summarizing teachings of a fluxless bonding process.

U.S. Pat. No. 4,845,335, assigned to the assignee of the present invention and hereby incorporated herein in its entirety by this reference thereto, describes a laser bonding apparatus and method by which strong, high temperature, inner lead bonds may be formed. Referring now to FIG. 2 of the instant document, shown therein is a bond structure somewhat along the lines of bond structures that can be formed based on the teachings of U.S. Pat. No. 4,845,335, but which bond structure involves fluxless reflow to a noteworthy degree. According to the teachings in U.S. Pat. No. 4,845,335, a tin plated copper lead may be bonded to a silicon substrate by disposing a gold bump between the lead and the substrate and subjecting the point of desired bonding to a beam pulse from a Nd: YAG laser. Further details regarding this method and apparatus may be found explicitly set forth in the referenced patent. According to the teachings of the present invention, in one embodiment at least, as shown in FIG. 2, a tin plated copper lead 20 may be bonded to a silicon substrate 22 by disposed a solder plated Ti Cu Ti layer 24 between the lead 20 and the substrate 22 and subjecting the point of desired bonding to a beam pulse 26 from a Nd: YAG laser. Further details regarding this embodiment are set forth below.

The inner lead bonds effected via the process taught in U.S. Pat. No. 4,845,335 are noteworthy with regard to the teachings herein for at least two reasons. First, such bonds may be effected or formed without the use of flux or coupling agents. From the discussion in the description of related art section above, this should be appreciated as desireable since the removal of flux and residue is a costly and time consuming process that is becoming increasingly difficult as bond pitches get smaller and smaller. A second reason the bonds formed via the process taught in U.S. Pat. No. 4,845,335 is noteworthy is that a certain element, tin, is a major metallurgical constituent in those bonds. As discussed in the description of related art section above, tin is frequently included in solder compositions, which compositions serve important functions in the formation of many bonds.

Heretofore, many people skilled in the art have avoided laser assisted soldering methods in designing processes and apparatus for commercial applications, believing, for example, that because laser beams do not penetrate to unexposed areas, they cannot be satisfactorily employed to solder joints. Further, those persons have also considered laser assisted methods to be overly time consuming because those methods employ a localized beam. An example of such thoughts may be found set forth in the background of the invention section of U.S. Pat. No. 4,921,157 to Dishon et al., which is further discussed in the description of related art section above. Recognizing the reluctance of certain persons skilled in the art to employ lasers for soldering process, some discussion of use of lasers to effect bonds is appropriately considered at this point and, thus, set forth immediately below.

A number of different types of laser technologies have now been developed to the point where they have been proven in production environments. One such type of laser technology is yttrium aluminum garnet ($YAG = Y_3Al_5O_{12}$) laser technology.

YAG lasers are solid state lasers with an output that is continuous wave (CW), shuttered with an acoustical-optic or electro-optic device (Q-switched), or pulsed. They have a wavelength of 1.064 microns. The laser output power for each of these different types of YAG lasers are all different, and these differences can have a profound effect upon the suitability of any particular laser for applications such as those described herein. The Q-switched laser permits lasing only when the Q-switch is open and there is a power spike of several nanoseconds duration at the beginning of each pulse which is capable of drilling a deep, small diameter hole in the bond site. A CW laser takes considerably more energy to melt bumps (referring to inner lead bonding, discussed above) than the Q-switched laser.

Figure 3:
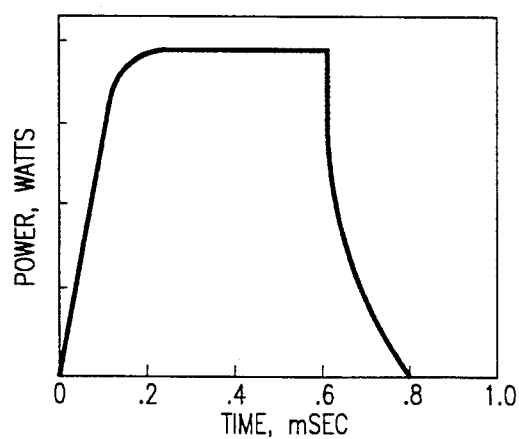
FIG. 3 is a graph showing the wave form of a pulsed YAG laser.

The power vs. time curve for a pulsed laser is shown in FIG. 3. In a pulsed laser the flashlamps are turned on and off for each pulse. As a result, there is an exponential increase in power output until a maximum level is reached at which point the power exponentially decreases. With a pulsed laser, the metals to be bonded are heated to a maximum temperature at which time the energy input exponentially decreases. The pulsed laser provides a higher power level at the middle of pulse than the Q-switched laser. However, the peak power is orders of magnitude less than the spike at the beginning of the Q-switched pulse. This power preheats the bond site and provides the bond site with the most power when it can use it most efficiently. It also provides decreasing power which should tend to allow less internal stress buildup than the instantaneous drop off of energy that is characteristic of the Q-switched or CW laser. It was found by the inventors of the present invention that a 50 watt pulsed YAG laser made by Carl Haas GmbH and Company was satisfactory for the process and apparatus described herein.

Figure 4:
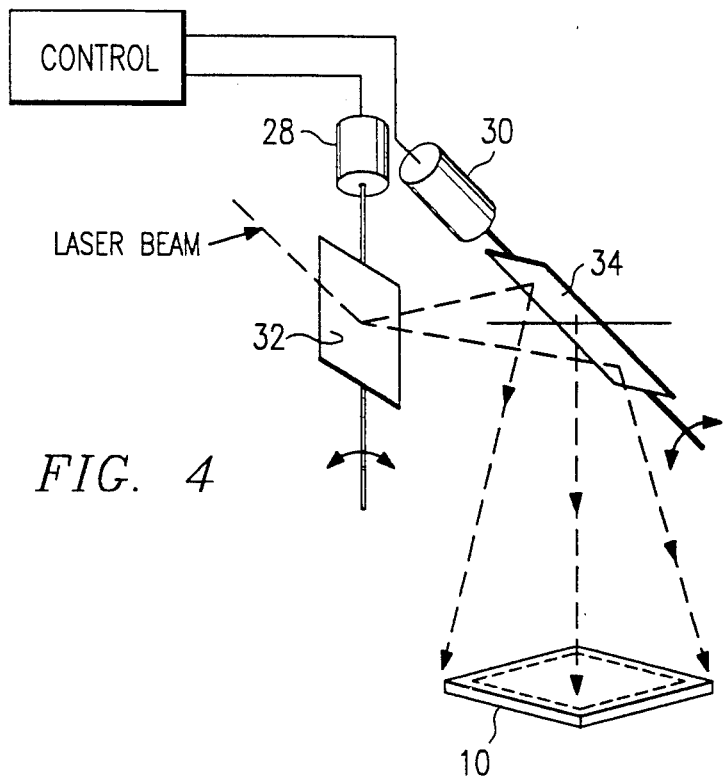
FIG. 4 is a schematic perspective view of one method of moving a laser beam for bonding a plurality of bonds.

While the present invention can be performed with a Q-Switched or CW laser, a pulsed YAG laser is preferred. Having selected a source of an appropriate laser beam, e.g., a pulsed YAG laser, the inventors of the present invention considered next how to deliver the laser beam to the appropriate reflow or bond sites, whether inner lead or outer lead sites. Needless to say, such a mechanism can involve moving the tape 10 and die 18 (see FIG. 1) or moving the laser beam 26 (see FIG. 2). As discussed in U.S. Pat. No. 4,845,335, it is generally considered more feasible in commercial production applications to move the beam 26. Referring to FIG. 4, a system involving a galvanometric laser beam steering system including galvanometers 28 and 30 and rotatable mirrors 32 and 34 was proposed in U.S. Pat. No. 4,845,335 as a suitable system for directing a laser beam to a desired location. Such a system could also be employed to effect flux solder reflow as taught herein.

The inventors of the present invention engaged in a multitude of experiments in developing and refining the present invention. Having selected a means for causing a laser beam to impinge as previously discussed, it was also necessary to select substrates upon which solder reflow could be effected. An underlying consideration in such selection was anticipated frequency of future use in actual commercial applications.

Based on the foregoing, the inventors of the present invention used epoxy-glass PWB's and silicon substrates in the various experiments they performed. The PWB's actually used were 62 mils thick with one and two ounce copper traces (1.4 and 2.8 mils thick, respectively) thereon. The conductor traces were electroplated with approximately 300 microinches of 60/40 tin/lead solder that was vapor phase reflowed. The solder was vapor phase reflowed to take advantage of the reported fact that reflow of plated solder removes brighteners which form corrosive gases at soldering temperatures, which gases subsequently cause de-wetting (a solderability mechanism that manifests itself by solder on the surface pulling back into irregular mounds) and low solder joint strength. The outer lead bond pads were one ounce copper 10 mils wide on 20 mil centers on certain of the PWB's and two ounce copper 25 mils wide on 40 mil centers on other of the PWB's.

The silicon substrates that were used for laser outer lead bonding experiments by the inventors of the present invention were 8501 designs, constructed by the assignee of the present invention, with only an outer lead bonding pad layer on the substrate. The conductors were 5 mils thick 60/40 lead tin solid plating on top of sputtered layers of Ti-Cu-Ti (500-2500-500 angstroms, respectively) directly over silicon. They had 4 mil wide pads on 8 mil centers.

Figure 5:
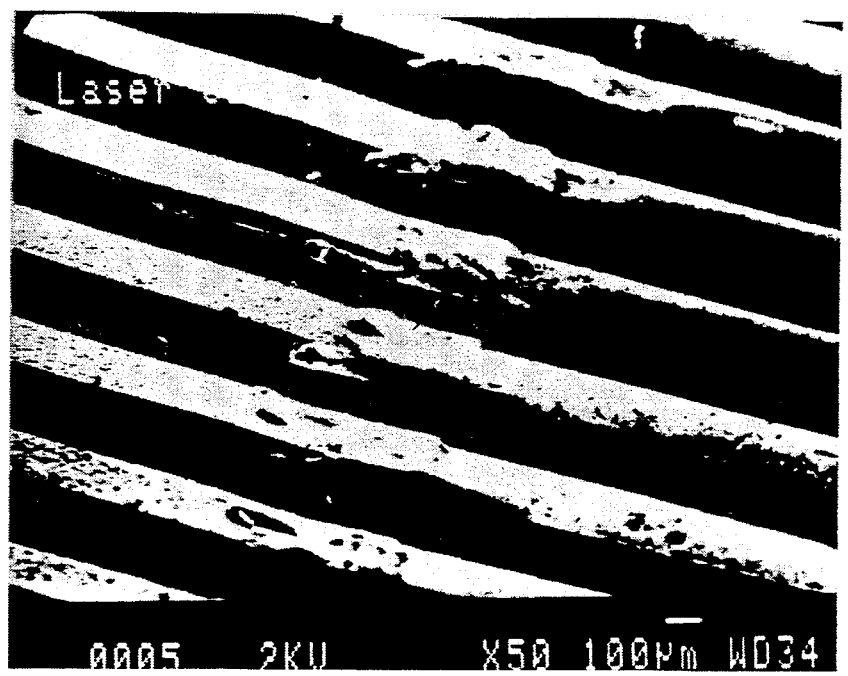
FIG. 5 is a scanning electron microscope (SEM) photograph of examples of solder reflowed without flux on an epoxy glass PWB.

As with inner lead bonding (see column 4, lines 57 et seq. of U.S. Pat. No. 4,845,335), it is very important to hold outer leads in uniform, intimate contact with pads so that repeatable high strength solder joints can be formed. In commercial production applications, such uniform contact can only be satisfactorily made using relatively sophisticated fixturing (see, e.g., FIG. 5 and the accompanying discussion in U.S. Pat. No. 4,845,335). In the actual experiments performed by the inventors of the present invention, such fixturing was not readily available so relatively simple hold-down techniques were employed instead. The techniques employed included use of masking tape to hold down leads and use of a dental instrument to accomplish the same task. It was found that holding the leads in intimate contact with the fine point of a dental instrument was satisfactory for establishing the fact that a pulsed YAG laser can be used to successfully reflow solder to form excellent solder joints without using any flux. Although, needless to say, such a technique could not feasibly be employed in an actual production environment, it is significant to note that solder reflow can be successfully effected by the teachings of the present invention, and conventional fixtures can also be modified and refined so as to effect proper contact in applications involving a large number of bonds.

Initial laser outer lead bonding experiments performed by the inventors of the present invention were with PWB's having 10 mil wide pads of one ounce copper on 20 mil centers. For these experiments the leads, which were 7 mils wide and plated with approximately 25 microinches of immersion tin, were held in contact with the pads using a hand-held dental pick on each lead. Previous attempts to hold the leads in contact with a glass slide over the bonds were unsuccessful because, due to PWB camber and the stiffness of the glass slide, intimate contact was not assured and after several bonds, slag, a by-product of the bonding process, was deposited on the underside of the glass thus prohibiting a portion the laser energy from reaching the bond site.

Figure 6:
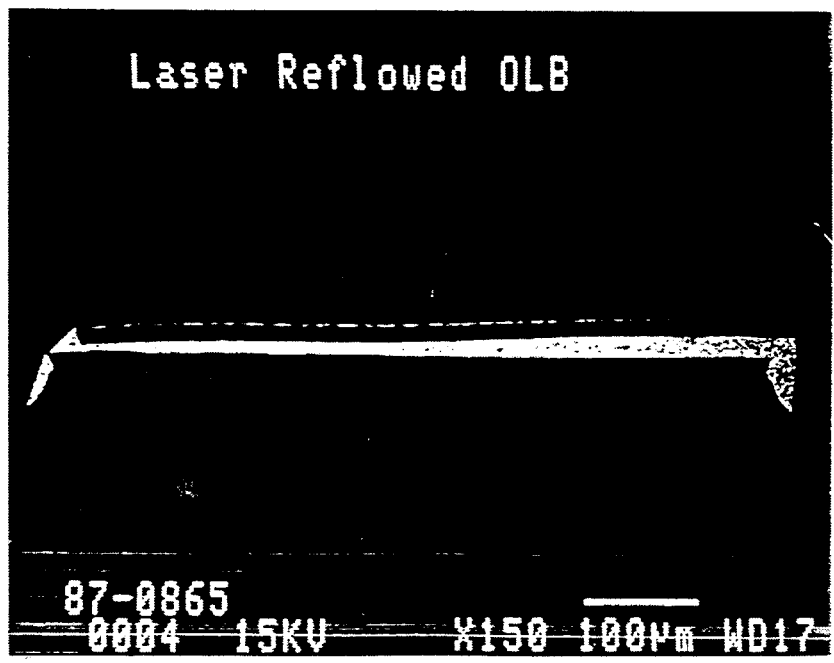
FIG. 6 is a SEM photograph of a cross section of solder reflowed without flux and by a laser.

After some experimentation with the pulsed YAG laser, it was found that satisfactory bonds could be made without flux by using a single 400 volt pulse of 2.5 msec duration attenuated to ⅓ thus yielding approximately 0.66 joules of total energy. Satisfactory bonds could also be made by varying these parameters as long as the total energy is 40–660 millijoules depending on the thermal mass of the structure. The laser beam was focused to an 8 mil diameter spot at the bond site. Examples of these laser outer lead solder joints are shown in the microphotograph presented as FIG. 5. Note that the reflowed region is small, indicating the ability of the laser to deliver energy to a very localized area. A cross-section of one of the solder joints is shown in the microphotograph presented as FIG. 6. As can be seen, there is very good wetting of the solder across both conductor interfaces. It should be noted that increasing the energy to 1.2 joules (2.5 msec @ 400 volts) caused the conductor traces to delaminate from the PWB.

Sixty bonds from these experimental samples were pull tested with two failure modes resulting. In some cases (17%) the lead and the conductor trace lifted from the PWB until the lead broke at 140–160 grams. The remaining 83% of the leads broke in span with forces ranging from 50 to 90 grams. The most desirable failure is when the lead breaks in span indicating that the bond and the rest of the structure is at least as strong as the copper lead. As a benchmark for appreciating the above, a suitable minimum acceptable pull strength is about 25 grams, regardless of location.

Figure 7:
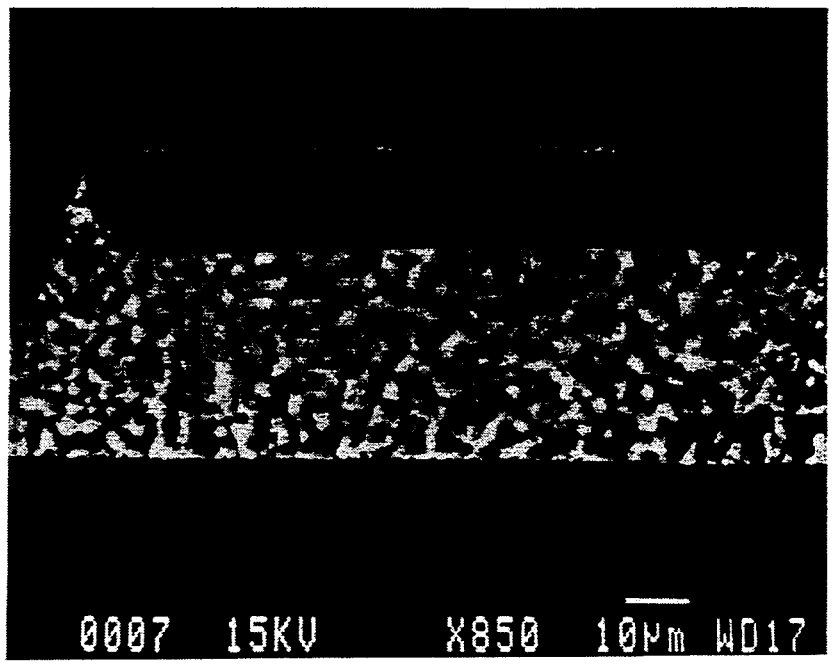
FIG. 7 is a SEM photograph of a cross section of a pulsed YAG reflowed solder joint (the light grey area is lead, and the dark grey area is tin)
Figure 8:
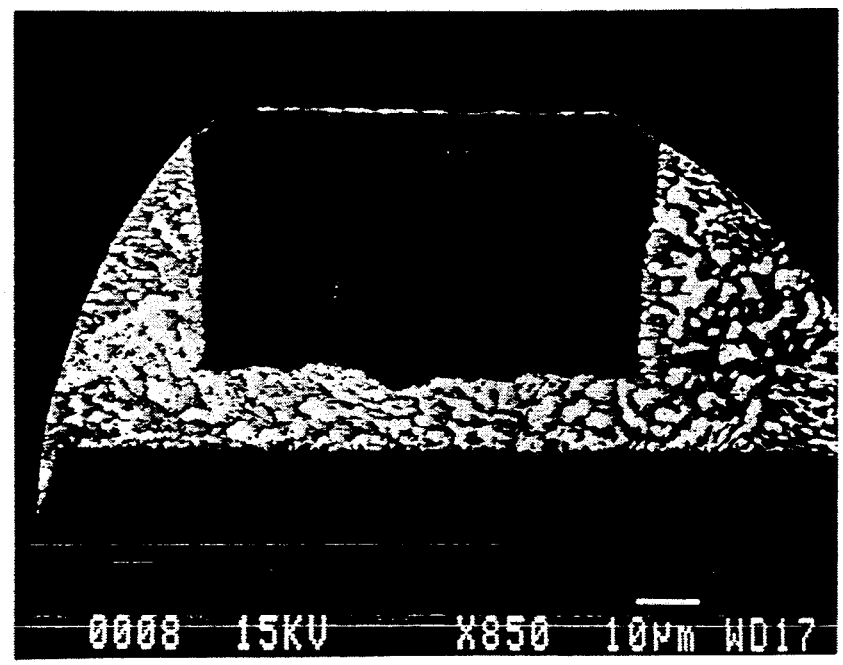
FIG. 8 is a SEM photograph of a conventionally reflowed (thermode) solder joint.
Figure 9:
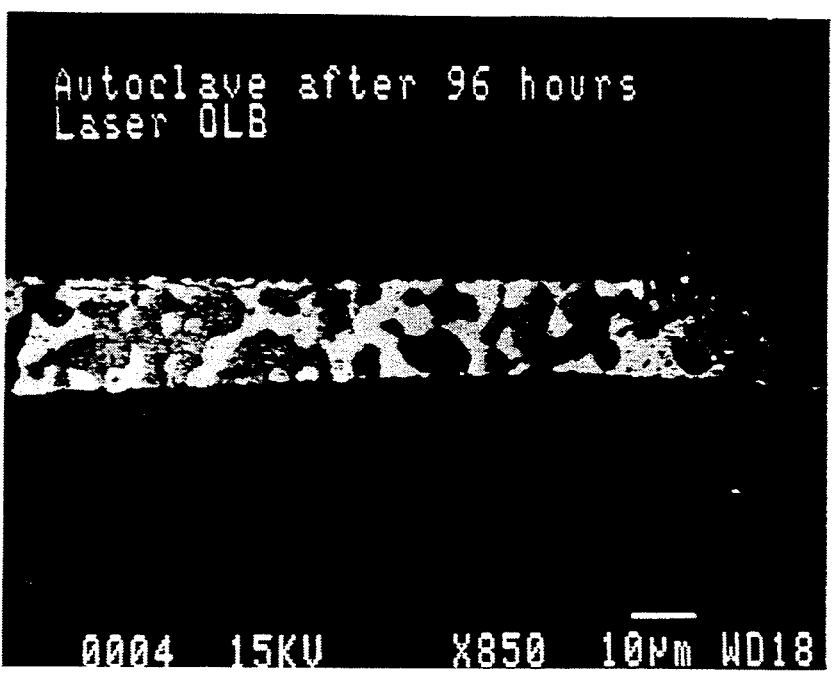
FIG. 9 is a SEM photograph depicting laser solder reflow after 96 hours of autoclave.
Figure 10:
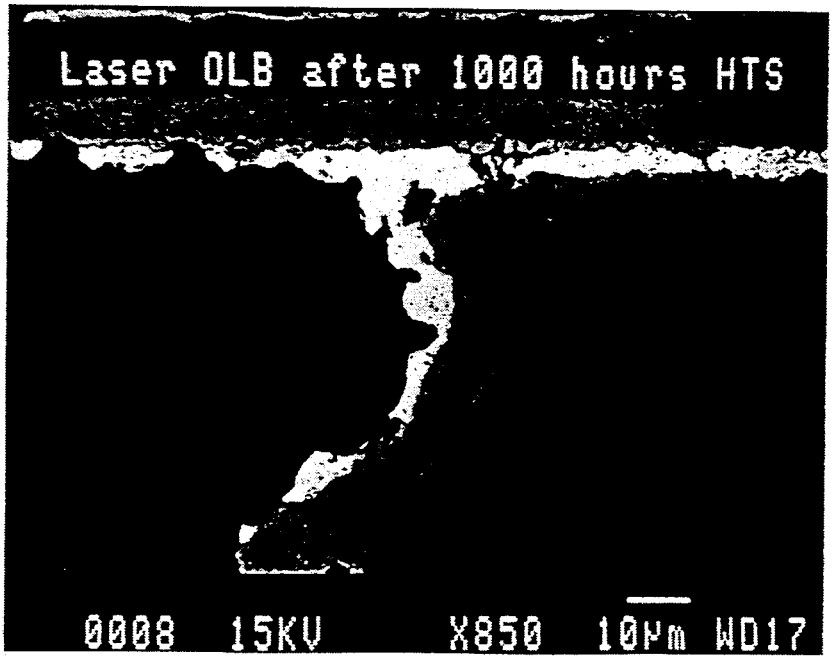
FIG. 10 is a SEM photograph depicting laser solder reflow after 1000 hours at 150 degrees C.
Figure 11:
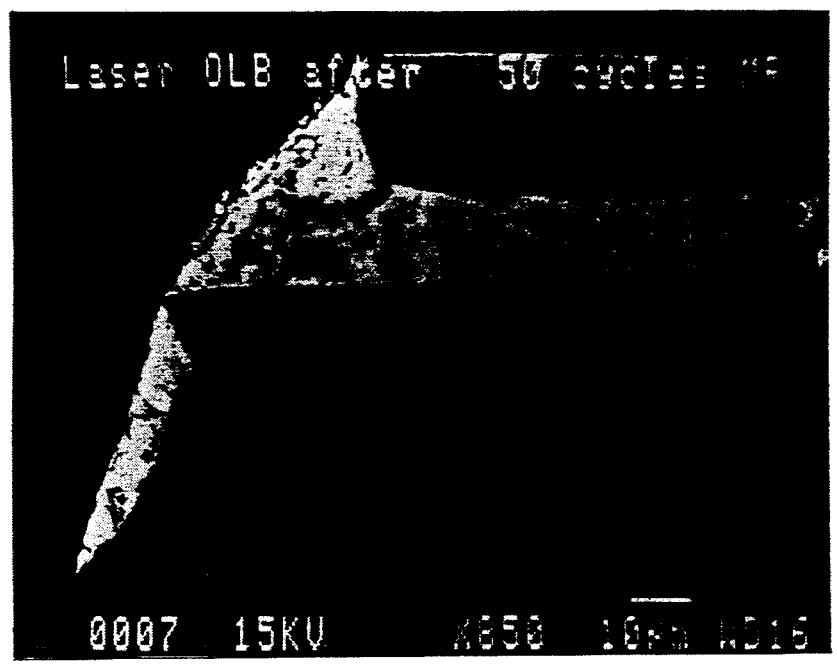
FIG. 11 is a SEM photograph depicting laser solder reflow after exposure to moisture resistance.
Figure 12:
FIG. 12 is a SEM photograph depicting laser solder reflow after 1000 hours at 85% relative humidity and 85 degrees C.
Figure 13:
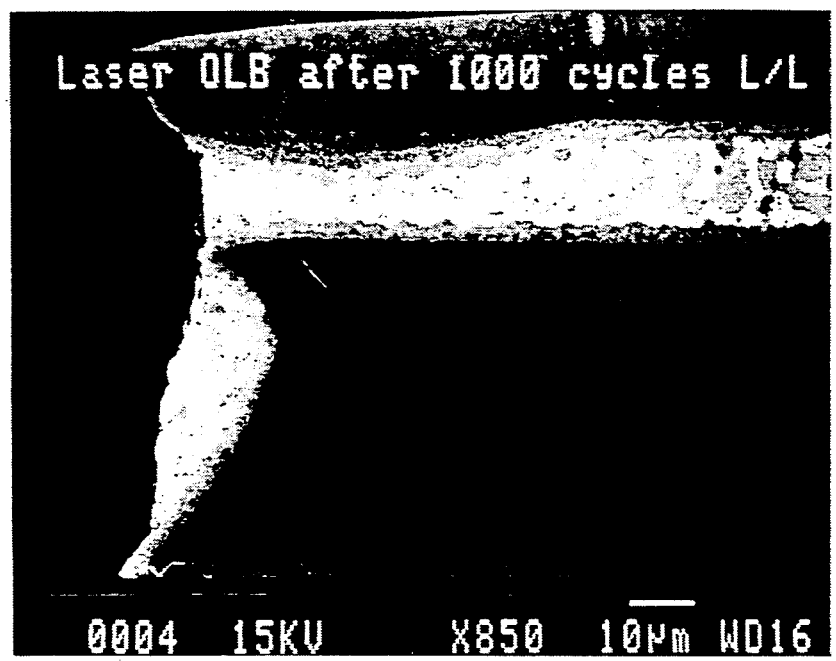
FIG. 13 is a SEM photograph depicting laser solder reflow after exposure to 1000 cycles of liquid to liquid thermal shock.
Figure 14:
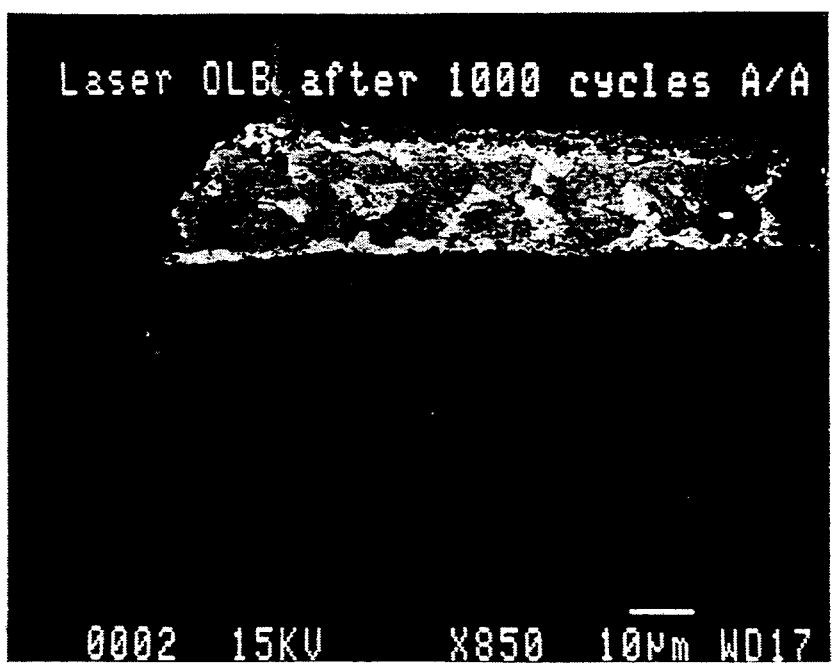
FIG. 14 is a SEM photograph depicting laser solder reflow after exposure to 1000 cycles of air to air temperature cycling.

FIG. 7 is a SEM photograph of a cross section of a pulsed YAG laser reflowed solder joint. When this is compared to a conventionally reflowed (thermode) solder joint as shown in FIG. 8, it can be seen that the grain structure of the laser reflowed solder is similar in size indicating that complete heat transfer occurred throughout the bond but in much less time than with the thermode. Since it takes less time to complete the reaction with the laser, there is less intermetallic compound formation resulting in a joint that is more stable over temperature and therefore more reliable.

Next, laser outer lead bonding samples were prepared for environmental testing. The PWB's with 25 mil leads on 40 mil centers were used. For these samples the leads were held in contact with a dental instrument during bonding. A single laser pulse of 350 volts for 10.5 msec (approximately 0.5 joules) was used. The laser beam was focused on the end of the lead so that approximately half of the laser beam was focused on the end of the lead while the other half was focused on the pad to which the lead was being soldered. After the PWB's were bonded, ten boards were subjected to each of the same environmental tests to which the inner lead bonded devices were exposed (see column 7, lines 40 et seq. of U.S. Pat. No. 4,845,335): autoclave, high temperature storage, moisture resistance, 85/85, liquid-to-liquid thermal shock and temperature cycling. After completing each environmental test, the solder joints were cross sectioned and photographed in a scanning electron microscope (SEM). The photographs are shown in FIGS. 9 through 14. As can be seen, there is little evidence of failure producing characteristics such as voids, de-wetting and large grain.

Figure 15:
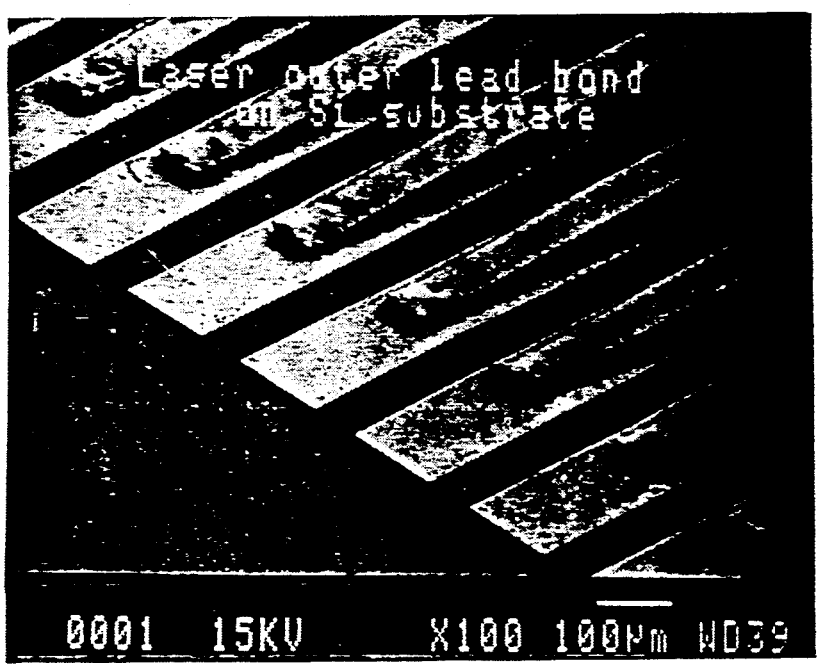
FIG. 15 is a SEM photograph depicting laser solder reflow to a silicon substrate without flux, further involving a 4 mil conductor on an 8 mil pitch.

As mentioned at the beginning of this section, experiments were also performed with silicon substrates. Since these substrates have smaller features (4 mil solder plated conductors on 8 mil centers), less energy was required to form bonds. FIG. 15 shows some bonds that were formed on a silicon substrate with single pulses of 360 volts of power for 0.6 msec for a total energy of about 0.1 joule. Again, it can be seen that high quality bonds can be made in very localized areas without using flux.

Based on the foregoing, those skilled in the art should now appreciate that the present invention provides a method and apparatus for reflowing solder that overcomes a number of deficiencies and shortcomings of the prior art. Not requiring use of flux, the present invention obviates need for post processing cleaning, offers a relatively inexpensive and reliable way of bonding small pitch devices, and is environmentally safer than prior art methods.

Obviously, numerous modifications and variations of the present invention are possible in view of the above teachings. For example, while a pulsed YAG laser was specifically used in the experiments described herein, it should be appreciated that other types of lasers, e.g., a CW YAG laser, could also be used for reflowing solder applications as taught herein. In fact, the inventors of the present invention have formed a solder joint involving solder reflow effected by a CW YAG laser. Those skilled in the art should appreciate that depending upon the materials present at the reflow site and their characteristic ability to absorb energy at various wavelengths, as well as output energy from lasers operated under various conditions, a multitude of fluxless solder reflow environments may be created in accordance with the teachings herein. Accordingly, within the scope of the appended claims, the present invention may be practice otherwise than as specifically described herein.

What is claimed is:

1. A method of soldering without the need for fluxing agents, comprising the steps of:
   creating a bond site having solder thereat;
   causing a pulsed laser beam to impinge upon said bond site; and
   reflowing said solder at said bond site.

2. The method of claim 1 wherein said bond site comprises a first surface with solder thereon and a second surface placed in contact with said solder.

3. The method of claim 2 wherein said first surface and said second surface are solder joined together without a need for post-soldering cleaning.

4. The method of claim 1 wherein said step of causing a pulsed laser beam to impinge comprises the step of generating a laser beam with a pulsed YAG laser.

5. The method of claim 4 wherein said pulsed YAG laser beam is focused on said bond site.

6. The method of claim 5 wherein said pulsed YAG laser beam is caused to deliver in the range of 40–660 millijoules of total energy.

7. The method of claim 6 wherein said pulsed YAG laser beam is caused to deliver in the range of 150–400 millijoules of total energy.

8. The method of claim 2 wherein said first surface comprises a printed wiring board.

9. The method of claim 8 wherein said first surface further comprises at least one copper trace.

10. The method of claim 9 wherein tin/lead solder is disposed on said at least one copper trace.

11. A method for reflowing solder without flux, said method comprising the steps of:
   placing a first metallic element in contact with a second, solder-plated element, thereby defining a bond site; and
   causing a pulsed laser beam to impinge upon said bond site.

12. The method of claim 11 wherein said solder comprises tin.

13. The method of claim 12 wherein said solder further comprises lead.

14. The method of claim 13 wherein said tin/lead solder is reflowed prior to bonding.

15. An apparatus for reflowing solder without flux comprising:
   means for placing a first surface in contact with a second, solder-plated surface, thereby defining a bond site; and
   means for causing a pulsed laser beam to impinge upon said bond site.

16. The apparatus of claim 15 wherein said pulsed laser beam is output by a YAG laser.

17. The apparatus of claim 16 wherein said YAG laser is pulsed.

18. The apparatus of claim 17 wherein said output energy of said pulsed YAG laser is in the range 40-660 millijoules.

* * * * *